United States Patent
Kitamura et al.

(10) Patent No.: US 9,530,664 B2
(45) Date of Patent: Dec. 27, 2016

(54) METHOD FOR MANUFACTURING ELECTRONIC DEVICE BY FORMING A HOLE IN A MULTILAYER INSULATOR FILM BY PLASMA ETCHING

(71) Applicant: CANON KABUSHIKI KAISHA, Tokyo (JP)

(72) Inventors: Shingo Kitamura, Fujisawa (JP); Aiko Kato, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/300,096

(22) Filed: Jun. 9, 2014

(65) Prior Publication Data

US 2014/0370710 A1 Dec. 18, 2014

(30) Foreign Application Priority Data

Jun. 13, 2013 (JP) ................................ 2013-124598

(51) Int. Cl.
 *H01L 21/31* (2006.01)
 *H01L 21/311* (2006.01)
 *H01L 27/146* (2006.01)
 *H01L 21/768* (2006.01)

(52) U.S. Cl.
 CPC ... *H01L 21/31116* (2013.01); *H01L 21/76898* (2013.01); *H01L 27/14623* (2013.01); *H01L 27/14627* (2013.01); *H01L 27/14629* (2013.01); *H01L 27/14632* (2013.01); *H01L 27/14636* (2013.01); *H01L 27/14685* (2013.01); *H01L 27/14687* (2013.01); *H01L 21/76804* (2013.01)

(58) Field of Classification Search
 None
 See application file for complete search history.

(56) References Cited

U.S. PATENT DOCUMENTS

2008/0280433 A1* 11/2008 Iba ............................... 438/637
2012/0202309 A1* 8/2012 Kondo ............. H01L 27/14687
 438/69

FOREIGN PATENT DOCUMENTS

| JP | 09-129595 A | 5/1997 |
| JP | 2009-272568 A | 11/2009 |
| JP | 2010-245506 A | 10/2010 |
| JP | 2011-096851 A | 5/2011 |
| JP | 2011-119426 A | 6/2011 |
| JP | 2012-164942 A | 8/2012 |
| WO | 2007-537602 A | 12/2007 |

* cited by examiner

*Primary Examiner* — Scott B Geyer
(74) *Attorney, Agent, or Firm* — Canon USA, Inc. I.P. Division

(57) ABSTRACT

A method includes the stage of partially removing a first insulator layer to form an opening passing through the first insulator layer by plasma etching using a gas of a first type, and the stage of partially removing a second insulator layer to form an opening passing through the second insulator layer by plasma etching using a gas of a second type. The gas of a first type contains a first component capable of etching the first insulator layer, and a gas of the second type contains a second component different from the first component, capable of etching the second insulator layer and a third component having a higher deposition ability than the second component.

20 Claims, 5 Drawing Sheets

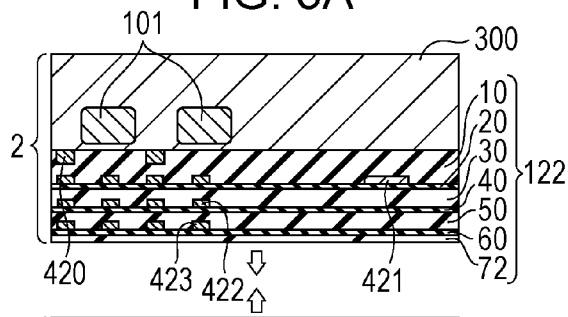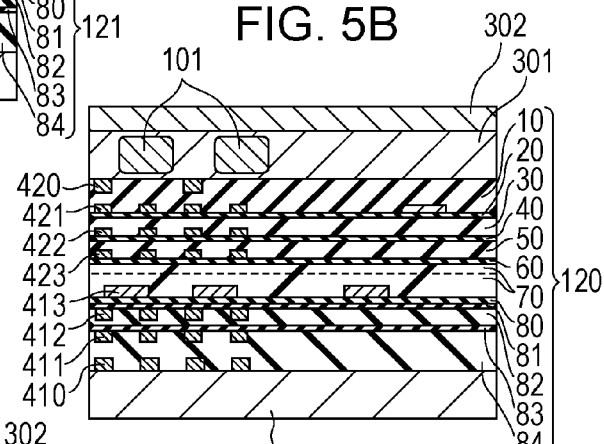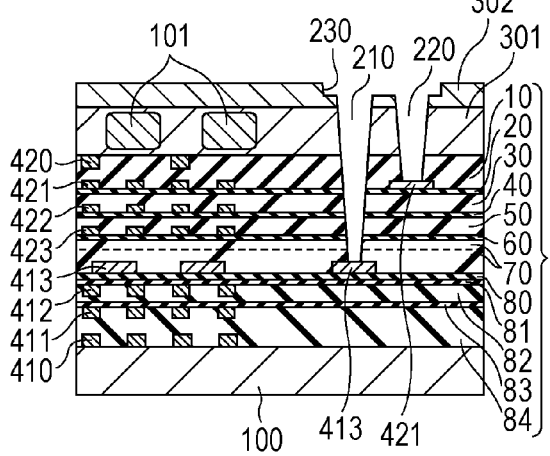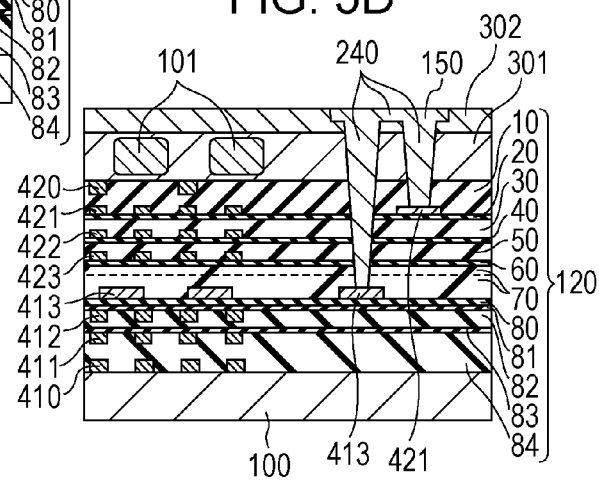

METHOD FOR MANUFACTURING ELECTRONIC DEVICE BY FORMING A HOLE IN A MULTILAYER INSULATOR FILM BY PLASMA ETCHING

BACKGROUND OF THE INVENTION

Field of the Invention

The present invention relates to a method for manufacturing an electronic device including a multilayer insulator film.

Description of the Related Art

An electronic device such as a semiconductor device includes a multilayer insulator film including a plurality of insulator layers made of different materials. For forming a hole in the insulator film, the insulator layers made of different materials are etched. The hole may be intended to form an optical waveguide or an electroconductive member therein.

Japanese Patent Laid-Open No. 2012-164942 teaches that openings are formed in a silicon oxide layer and a silicon nitride layer under a condition of low selectivity or a small ratio of the etching rates of silicon oxide and silicon nitride. More specifically, this patent document discloses an anisotropic plasma etching using a mixed gas of a hydrogen-containing fluorocarbon such as $CHF_3$ and any other fluorocarbon gas such as $C_4F_8$, oxygen, and an inert gas such as argon.

Japanese Patent Laid-Open No. 2009-272568 discloses a process for etching, for example, silicon oxide and silicon nitride or silicon carbide while the conditions are changed according to the materials.

If a member is embedded in a hole formed in an insulator film, it is desirable that the side wall of the hole has a smooth surface from the viewpoint of reducing the formation of voids.

When etching is performed under a condition of a low selectivity as disclosed in Japanese Patent Laid-Open No. 2012-164942, unfortunately, a smooth side wall cannot be formed in some combinations of the materials of the insulator layers. In addition, the side wall cannot be made smooth by simply changing the etching conditions according to the materials of the layers as disclosed in Japanese Patent Laid-Open No. 2009-272568.

SUMMARY OF THE INVENTION

Accordingly, the present invention provides a method for forming a hole having a smooth side wall in a process for manufacturing an electronic device including a multilayer insulator film.

According to an aspect of the invention, a method is provided for manufacturing an electronic device. The method includes forming a hole in a multilayer insulator film including a first insulator layer overlying a substrate, a second insulator layer disposed between the substrate and the first insulator layer and made of a different material from the first insulator layer, and a third insulator layer disposed between the second insulator layer and the substrate and made of a different material from the second insulator layer. The step of forming the hole includes partially removing the first insulator layer to form an opening passing through the first insulator layer by plasma etching using a gas of a first type containing a first component capable of etching the first insulator layer, and partially removing the second insulator layer to form an opening passing through the second insulator layer by plasma etching using a gas of a second type containing a second component different form the first component, capable of etching the second insulator layer, and a third component having a higher deposition ability than the second component. The step further includes partially removing the third insulator layer to form an opening passing through the third insulator layer by plasma etching using a gas of the first type.

Further features of the present invention will become apparent from the following description of exemplary embodiments with reference to the attached drawings.

BRIEF DESCRIPTION OF THE DRAWINGS

FIGS. 5A to 5D are schematic sectional views illustrating the method for manufacturing an image sensing device according to another embodiment.

DESCRIPTION OF THE EMBODIMENTS

Figure 1:
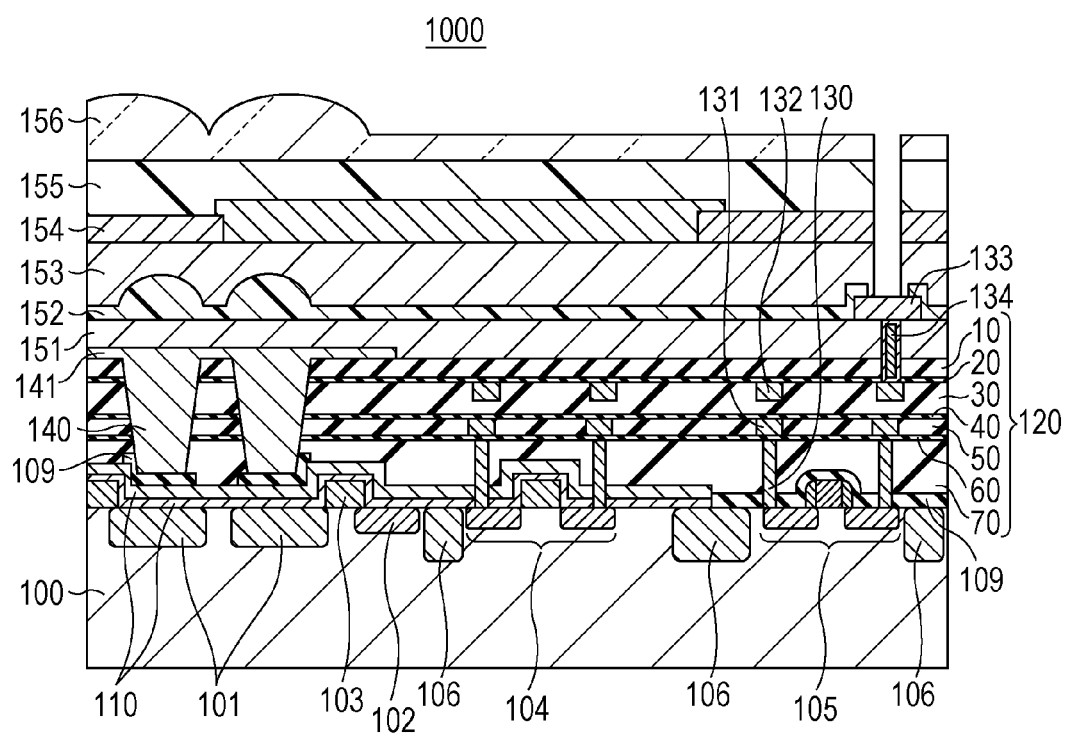
FIG. 1 is a schematic sectional view of an image sensing device according to an embodiment of the invention.

Embodiments of the invention will now be described with reference to the drawings. For some parts of the following description, two or more figures may be reciprocally referenced. The same parts in the figures are designated by the same reference numerals, and thus description thereof is omitted.

Although an image sensing device will be described by way of the example of the electronic device of the disclosure, the electronic device may be a memory device, an arithmetical unit, a display device, or the like. Also, the electronic device may be an active device or a passive device.

FIG. 1 is a schematic sectional view of an image sensing device 1000 according to an embodiment of the invention. The image sensing device 1000 includes semiconductor elements in a substrate 100, such as photoelectric conversion portions 101, a floating diffusion region 102, a transfer gate 103, and amplification transistors 104, corresponding to the image sensing region thereof. These semiconductor elements are separated by element isolation portions 106 as needed. The image sensing device 1000 also includes transistors 105 having a lightly doped drain (LDD) structure (not shown) in an outer region thereof. The substrate 100 is generally a silicon substrate, but may be a glass substrate provided with thin-film semiconductor elements thereon.

An insulator film 120 overlies the substrate 100. A protective film 110 is disposed between the substrate 100 and the insulator film 120. The insulator film 120 includes an insulator layer 70, an insulator layer 60, an insulator layer 50, an insulator layer 40, and an insulator layer 30, an insulator layer 20 and an insulator layer 10 that are formed in that order over the substrate 100. The insulator layers 70, 50, 30, and 10 are made of a different material from the insulator layers 60, 40 and 20. Hence, any two adjacent insulator layers of the insulator film 120 are made of different materials from each other, and two types of insulator layers are alternately disposed. Insulator layers 70, 50, 30 and 10 are made of, for example, silicon oxide or silicate glass. Insulator layers 60, 40 and 20 are made of, for example, silicon carbide or silicon nitride. If the insulator layers 60, 40 and 20 are not made of silicon nitride, the insulator layers 70, 50, 30 and 10 may be made of silicon nitride.

The insulator film 120 holds conductive lines connected to transistors. The conductive lines include contact plugs 130, a first conductor layer 131, a second conductor layer 132, a third conductor layer 133 and a via plug 134. The first conductor layer 131, the second conductor layer 132 and the third conductor layer 133 each have been formed into a wiring pattern. The first conductor layer 131 and the second conductor layer 132 are mainly made of, for example, copper. The contact plugs 130 and the via plug 134 may mainly contain tungsten, and the third conductor layer 133 may mainly contain aluminum. The second conductor layer 132 includes a via plug (not shown) connected to the first conductor layer 131. This via plug is integrated with the wiring pattern. The contact plugs, the via plugs and the conductor layers may contain a barrier metal.

The insulator layers 70, 50, 30 and 10 each have a larger thickness than their adjacent insulator layers 60, and 20. For example, the thickness of each of the insulator layers 70, 50, 30 and 10 is twice or more the thickness of the adjacent insulator layers 60, 40 and 20. In particular, the insulator layer 30 may have a thickness five times or more as large as the thickness of the adjacent insulator layers 40 and 20.

The insulator layers 60, 40 and 20 function as anti-diffusion layers that prevent the copper in the conductor layers 131 and 132 from diffusing into the insulator layers 70, 50, 30 and 10. Accordingly, the diffusion coefficient of the copper in the insulator layers 60, 40 and 20 is lower than that in the insulator layers 70, 50, 30 and 10.

The insulator layers 70, 50, 30 and 10 function as interlayer insulating layers for the conductor layers 131, 132 and 133. For example, the insulator layer 30 lies between the first conductor layer 131 and the second conductor layer 132 to electrically isolate the first conductor layer 131 and the second conductor layer 132 from each other. The via plug integrated with the second conductor layer 132 passes through the insulator layer 30.

Light transmissive portions 140 made of a dielectric material are disposed corresponding to the photoelectric conversion portions 101. Each light transmissive portion 140 passes through the insulator layers of the insulator film 120. In other words, the light transmissive portion 140 is enclosed in the insulator layers of the insulator film 120. If two types of insulator layers (insulator layers 60, 40 and 20 and insulator layers 70, 50, 30 and 10) having different refractive indices are alternately disposed over the photoelectric conversion portions 101, light loss is increased because light is reflected at each interface between these insulator layers. The presence of the light transmissive layer 140 passing through the insulator layers reduces the number of interfaces overlying the photoelectric conversion portion 101 and increases sensitivity. The refractive index of the insulator layers 70, 50, 30 and 10 may be the same as that of the light transmissive portion 140, but is desirably different. The light transmissive portion having a different refractive index from these insulator layers can function as an optical waveguide. For example, the light transmissive portion 140 may be made of a dielectric material having a higher refractive index than the material of the relatively thick insulator layers of the insulator film 120, that is, the insulator layers 70, 50, 30 and 10 made of, for example, silicon oxide. The difference in refractive index between the light transmissive portion 140 and the insulator layers 70, 50, 30 and 10 enables light entering the light transmissive portion 140 to reflect totally toward the photoelectric conversion portion 101. The optical waveguide may be based on metallic reflection without being limited to total internal reflection. The light transmissive portions 140 are connected to each other with a connecting portion 141 made of the same material as the light transmissive portions 140 and disposed on the insulator film 120. The connecting portion 141 is however not necessarily provided.

An intermediate film 151 overlies the light transmissive portions 140 and the connecting portion 141. The intermediate film 151 has a lower refractive index than the light transmissive portions 140. A passivation film 152 overlies the intermediate film 151. The passivation film 152 has a higher refractive index than the intermediate film 151. The passivation film 152 has portions having a lens-like shape corresponding to the photoelectric conversion portions 101. The lens-like portions function as in-layer lenses. The intermediate film 151 and the passivation film 152 may have a multilayer structure including an anti-reflection layer to prevent light from reflecting at the interface. The passivation film 152 covers part of the third conductor layer 133 acting as electrode pads. Over the passivation film 152, a first planarizing film 153, a color filter array 154, a second planarizing film 155, and a microlens array 156 are disposed.

A method for manufacturing such an image sensing device will now be described with reference to FIGS. 2A to 2D.

Figure 2A:
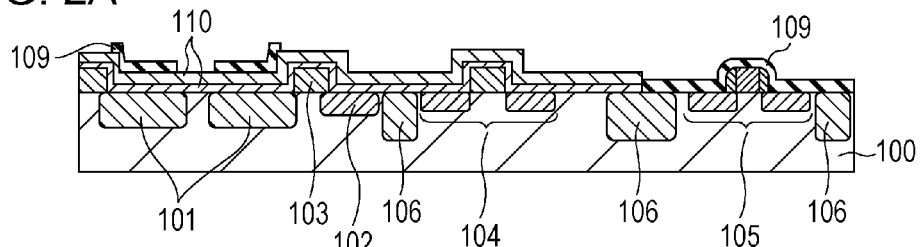
FIGS. 2A to 2D are schematic sectional views illustrating a method for manufacturing the image sensing device.

FIG. 2A shows the first step of preparing a substrate 100. The substrate 100 includes semiconductor elements, such as transistors and diodes, formed by a known semiconductor process. The substrate 100 is covered with a protective film 110. FIG. 2A exemplifies the protective film 110 having two layers. A silicon nitride layer 109 is formed on the protective film 110.

Figure 2B:
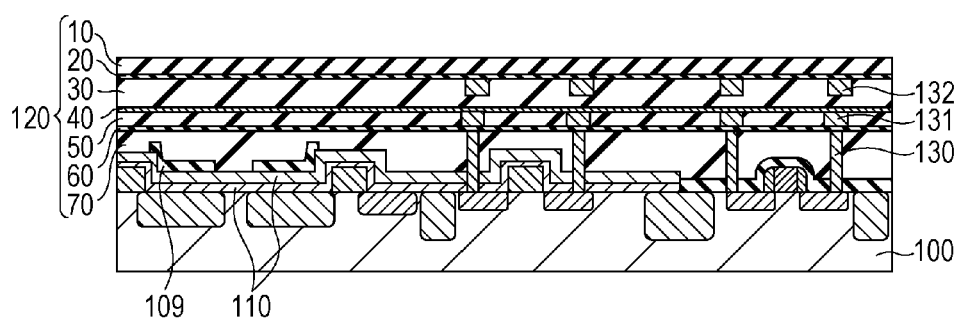

FIG. 2B shows the second step of forming a multilayer insulator film 120 over the substrate 100. In this step, the insulator film 120 includes insulator layers 10, 20, 30, 40, 50, 60 and 70 that do not have openings defining holes 210 that will be described later. In parallel with the formation of the insulator film 120, contact plugs 130, a first conductor layer 131 and a second conductor layer 132 are formed to provide conductive lines. The conductive lines can be formed by a known semiconductor process.

Figure 2C:
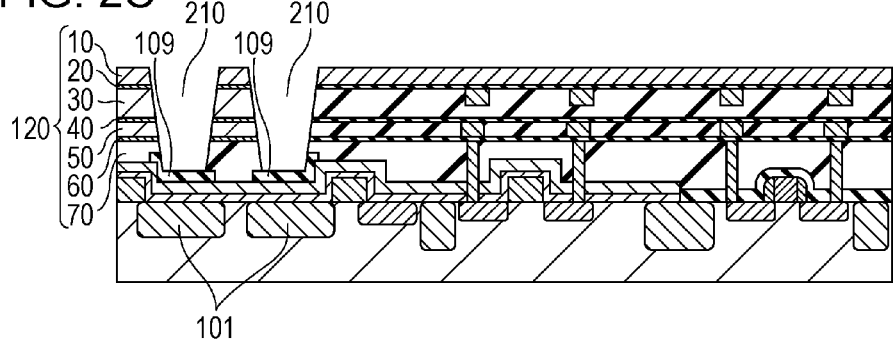

FIG. 2C shows the third step of forming holes 210 in the regions corresponding to the photoelectric conversion portions 101 of the insulator film 120 formed in the second step. By forming the holes 210, the insulator layers 10, 20, 30, 40, 50, 60 and 70 each have an opening. The holes 210 are formed by partially removing each of the insulator layers 10, 20, 30, 40, 50, 60 and 70 by plasma etching. Reactive ion etching (RIE), which allows etching having high anisotropy in the etching direction, is advantageous as the plasma etching. For RIE, for example, a capacitive coupling (parallel-plate) RIE apparatus may be used. Alternatively, a dielectric coupling or electron-cyclotron resonance (ECR) RIE apparatus may be used.

By changing gases (process gas) used in the plasma etching apparatus depending on the material of the insulator layer to be etched, the hole 210 can be formed in a favorable shape. The process gas contains at least a high etching component. The terms "high etching component" refers to the component of a process gas having the highest etching power for the material to be etched. The high etching component is an etching gas for etching a member to be etched. The magnitude of etching power is represented by the etching rate. The process gas may contain a low etching component. The term "low etching component" refers to the component having a lower etching power than the high etching component. The process gas may also contain a high deposition component. The terms "high deposition component" refers to the component of a process gas having the highest ability to be deposited on a member to be worked. Known deposition gases can be used as the high deposition component. The ability of a gas to be deposited can be represented by the deposition rate of the gas. The process gas may also contain a low deposition component. The term "low deposition component" refers to the component having a lower deposition ability than the high deposition component. The low deposition component may be a known gas that cannot be easily deposited without being limited to gases that will absolutely not be deposited. A specific gas may double as a high etching component and a high deposition component. The process gas may also contain $O_2$ and an inert gas, such as Ar. The deposition ability of the high deposition component is higher than that of the inert gas in the process gas.

The operation of the third step is continued until a predetermined layer is exposed. This predetermined layer defines the bottom of the hole 210. In the present embodiment, the predetermined layer defining the bottom of the hole 210 is the silicon nitride layer 109 of the protective film 110.

The present embodiment features the third step. The third step will be described in detail later.

Figure 2D:
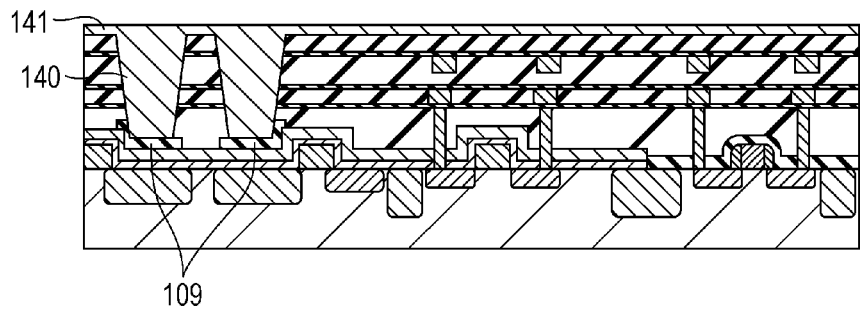

FIG. 2D shows the fourth step of filling the holes 210 in the insulator film 120. The holes 210 are filled with a filling material 240 to form the above-described light transmissive portions 140. For example, the holes 210 may be filled with a dielectric material having a higher refractive index than the insulator layers 70, 50, 30 and 10. The side walls of the holes 210 may be covered with a silicon nitride coating, and then the spaces surrounded by the silicon nitride coating are filled with a resin. At this time, the silicon nitride coating covering the bottoms of the holes 201 may be removed or left. The entirety of the holes 210 may be filled with silicon nitride. After depositing a filling material 240, the top of the filling material 240 may be appropriately planarized by, for example, chemical mechanical polishing (CMP). By removing the filling material 240 by CMP until the insulator film 120 is exposed, a connecting portion 141 can be removed.

Then, the intermediate film 151, the via plug 134, the third conductor layer 133 and the passivation film 152 shown in FIG. 1 are formed in a fifth step (not shown). These members can be formed using known techniques.

In a sixth step subsequent to the fifth step, the first planarizing film 153, the color filter array 154, the second planarizing film 155 and the microlens array 156 shown in FIG. 1 are formed. These members can be formed using known techniques.

Thus the image sensing device 1000 is completed.

The holes 210 formed in the third step are required to have smooth side walls. In addition, the holes 210 are desirably in a forwardly tapered shape. This is advantageous in preventing the formation of voids in the filling material 240 and in satisfactorily filling the holes. If the side walls of the holes 210 have rough surfaces having protrusions and recesses, the filling material 240 is more easily attached to the protrusions than to the recesses and thus cannot satisfactorily fill the holes 210. Also, if voids are formed in the light transmissive portions 140 in the holes 210, light is scattered by the voids. This can be a cause of the degradation of sensitivity. In addition, when the light transmissive portions 140 act as waveguides, the holes 210 having smooth side walls allows light to reflect at the side wall without scattering. Accordingly, sensitivity is increased, and noise resulting from stray light is reduced. Furthermore, the forwardly tapered waveguide is advantageous in collecting light and can increase the sensitivity. If the light transmissive portions 140 are used as waveguides, the side walls of the holes 210 are desirably tilted at an angle in the range of 83° to 87°.

A technique for forming a hole 210 having such a favorable shape will now be described with reference to FIGS. 3A to 4D. FIGS. 3A to 4D are enlarged sectional views illustrating the portion overlying the photoelectric conversion portions 101, in which the holes 210 are formed.

Figure 3A:
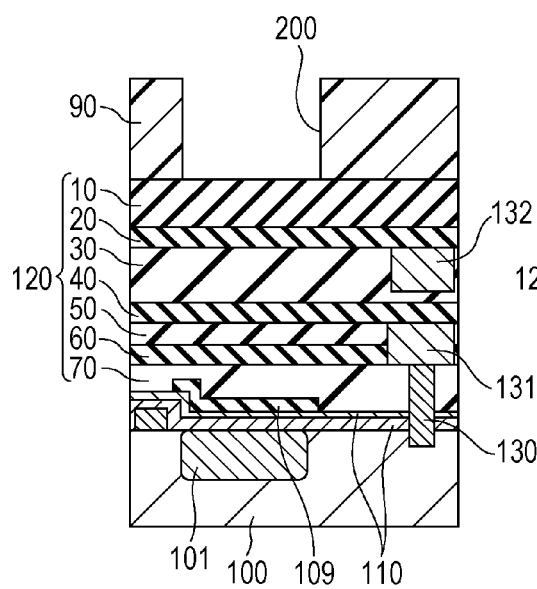
FIGS. 3A to 3D are schematic sectional views illustrating a process for forming a hole.

FIG. 3A shows the stage of preparation for the third step. A resist layer 90 having openings 200 corresponding to the shape in plan view of the holes 210 is formed over the insulator film 120 including the insulator layers 10, 20, 30, 40, 50, 60 and 70.

Figure 3B:
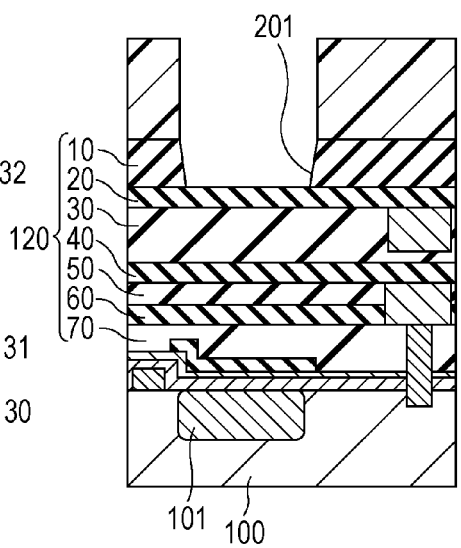

FIG. 3B shows a first stage of the third step. An opening 201 is formed in the insulator layer 10, which is a silicon oxide layer, by partially removing the insulator layer 10 by plasma etching using the resist layer 90 as a mask. The opening 201 passes through the insulator layer 10 and exposes the insulator layer 20.

Figure 3C:
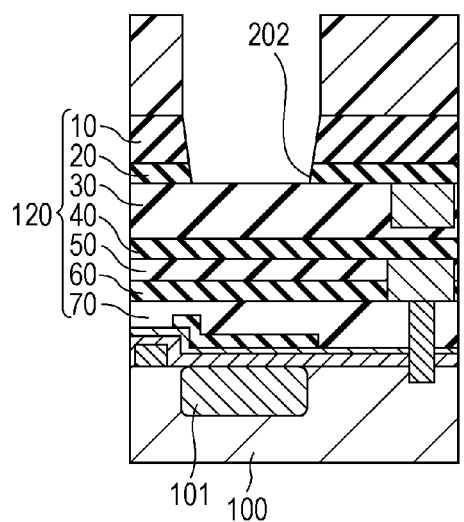

FIG. 3C shows a second stage of the third step. An opening 202 is formed in the insulator layer 20, which is a silicon carbide layer, by partially removing the insulator layer 20 by plasma etching using the resist layer 90 and the insulator layer 10 as a mask. The opening 202 passes through the insulator layer 20 and exposes the insulator layer 30.

Figure 3D:
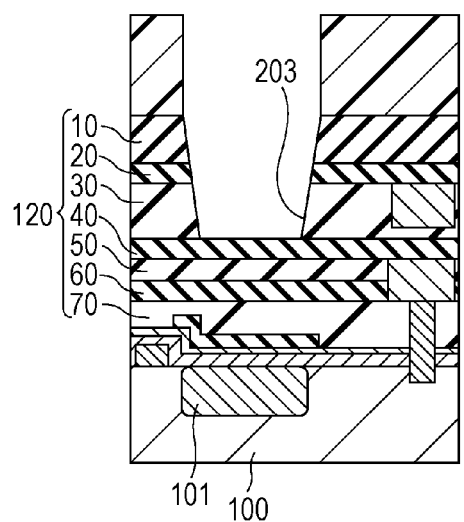

FIG. 3D shows a third stage of the third step. An opening 203 is formed in the insulator layer 30, which is a silicon oxide layer, by partially removing the insulator layer 30 by plasma etching using the resist layer 90 and the insulator layer 20 as a mask. The opening 203 passes through the insulator layer 30 and exposes the insulator layer 40.

Figure 4A:
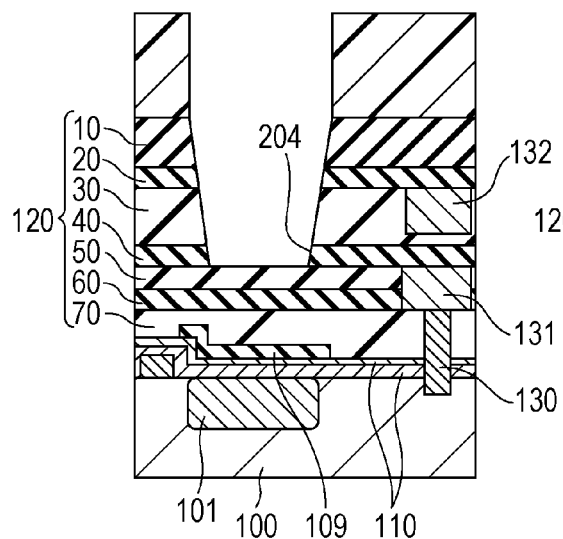
FIGS. 4A to 4D are schematic sectional views illustrating the process for forming the hole.

FIG. 4A shows a fourth stage of the third step. An opening 204 is formed in the insulator layer 40, which is a silicon carbide layer by partially removing the insulator layer 40 by plasma etching using the resist layer 90 and the insulator layer 30 as a mask. The opening 204 passes through the insulator layer 40 and exposes the insulator layer 50.

Figure 4B:
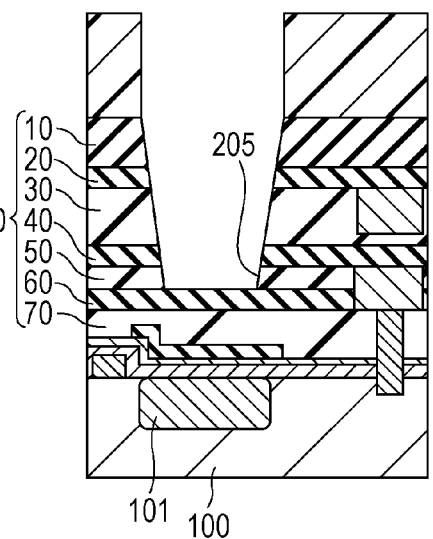

FIG. 4B shows a fifth stage of the third step. An opening 205 is formed in the insulator layer 50, which is a silicon oxide layer, by partially removing the insulator layer 50 by plasma etching using the resist layer 90 and the insulator layer 40 as a mask. The opening 205 passes through the insulator layer 50 and exposes the insulator layer 60.

Figure 4C:
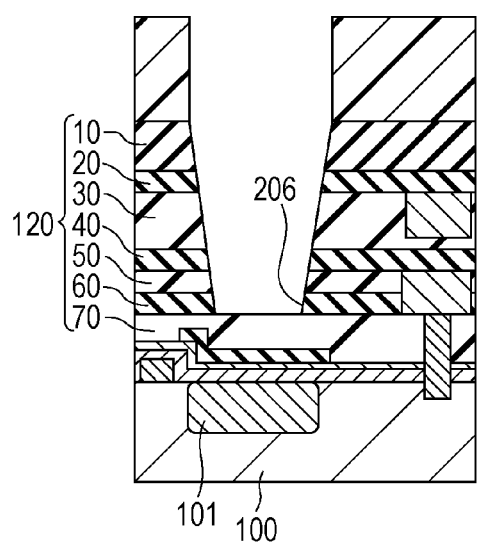

FIG. 4C shows a sixth stage of the third step. An opening 206 is formed in the insulator layer 60, which is a silicon carbide layer, by partially removing the insulator layer 60 by plasma etching using the resist layer 90 and the insulator layer 50 as a mask. The opening 206 passes through the insulator layer 60 and exposes the insulator layer 70.

Figure 4D:
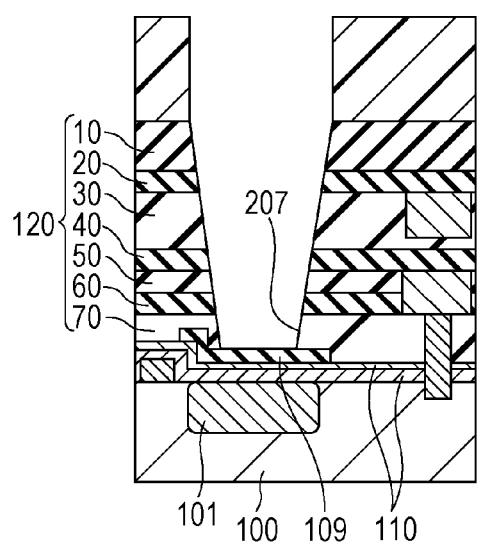

FIG. 4D shows a seventh stage of the third step. An opening 207 is formed in the insulator layer 70, which is a silicate glass layer, by partially removing the insulator layer 70 by plasma etching using the resist layer 90 and the insulator layer 60 as a mask. The opening 207 passes through the insulator layer 70 and exposes the silicon nitride layer 109 on the protective film 110. The silicon nitride layer 109 is the "predetermined layer" defining the bottom of the hole 210.

The Table shows the exemplary compositions of the process gases for the silicon oxide layers as the insulator layers 50, 30 and 10 and the silicon carbide layers as the insulator layers 60, 40 and 20. In this instance, the insulator layer 70 is made of boron phosphorus silicate glass (BPSG).

The Table shows, for each function, component gases contained in the process gases used in the respective stages. The high etching component and low etching component shown for each stage imply the levels of their etching powers for the target insulator layer in which an opening is to be formed. For example, the $CHF_3$ shown as a high etching component in the first stage implies that it has a high etching power for the silicon oxide layer. Gases having a plurality of functions are shown across plural regions of functions.

TABLE

| Stage | Low deposition component | High etching component | High deposition component | Low etching component | Other components |
|---|---|---|---|---|---|
| 1 | — | | $C_4F_8$ $CHF_3$ | — | $O_2$ Ar |
| 2 | | $CF_4$ | | $CH_2F_2$ | $O_2$ Ar |
| 3 | — | | $C_4F_8$ $CHF_3$ | — | $O_2$ Ar |
| 4 | | $CF_4$ | | $CH_2F_2$ | $O_2$ Ar |
| 5 | — | | $C_4F_8$ $CHF_3$ | — | $O_2$ Ar |
| 6 | | $CF_4$ | | $CH_2F_2$ | $O_2$ Ar |
| 7 | — | | $C_4F_6$ | — | $O_2$ Ar |

The process gas used in the first, third and fifth stages is a mixed gas containing $C_4F_8$, $CHF_3$, $O_2$ and Ar. The process gas used in the second, fourth and sixth stages is a mixed gas containing $CH_2F_2$, $CF_4$, $O_2$ and Ar. The process gas used in the seventh stage is a mixed gas containing $C_4F_6$, $O_2$ and Ar.

The high etching component of the process gas used in the first, third and fifth stages may be either or both of the gases: $C_4F_8$ and $CHF_3$. The etching gas for silicon oxide may be selected various gases including $C_5F_8$, $C_3F_6$, and $CF_4$ without being limited to $C_4F_8$ or $CHF_3$. $CF_4$ used as the etching gas for silicon carbide may be replaced with $SF_6$ or $NF_3$. $CF_4$ is however more suitable because it has a higher etching rate for silicon carbide than $SF_6$ or $NF_3$. $CH_2F_2$ may be replaced with $CHF_3$ or $CH_3F$. $CHF_3$ acts as a high etching component and a high deposition component for silicon oxide layers, but acts as a low etching component and a high deposition component for silicon carbide layers. $C_4F_6$ may be replaced with $C_4F_8$. These gases used for etching the silicon oxide layers or the silicate glass layer may be used for etching silicon oxide-based layers made of silicon oxide carbide (SiOC). The insulator layers 70, 50, 30 and 10 may therefore be made of silicon oxide carbide if the process gas shown in the Table is used. The gas used for etching the silicon carbide layers can etch silicon carbide-based layers made of silicon carbide nitride (SiCN). The insulator layers 60, 40 and 20 may therefore be made of silicon carbide nitride if the process gases shown in Table 1 are used.

The RF power in each stage is in the range of 100 W to 4000 W. The total pressure of the process gas (pressure in the process or chamber) is in the range of 10 mTorr to 100 mTorr. The flow rate of Ar, which is an inert gas, is in the range of 50 sccm to 1000 sccm, and the flow rates of the other gases are in the range of 5 sccm to 50 sccm. Ar gas accounts for a large proportion in the process gas, and the flow rates of the other gases are set lower than that of Ar gas. These conditions are appropriately set according to the thickness or the like of the layer to be worked. When insulator layers 60, 40 and 20 have smaller thicknesses than insulator layers 70, 50, 30 and 10, the RF power in the second, fourth and sixth stages is set lower than that in the first, third, fifth and seventh stages and the pressure of the process gas in the former stages is set higher than in the latter stages. Also, the flow rate of Ar gas in the former stages is set lower than that in the latter stages.

The third stage, in which an opening 203 is formed in the insulator layer 30 having the largest thickness of the insulator layers of the insulator film 120 and disposed between the first conductor layer 131 and the second conductor layer 132, and the fourth stage subsequent to the third stage will now be described in detail by way of example.

The shape of the opening 203 formed in the third stage is affected by the etching conditions in the fourth stage, and thus the opening 203 and the etching conditions in the fourth stage have a close connection with each other. In the following description, the process gas used in the third stage is referred to as a first type gas or a gas of a first type, and the process gas used in the fourth stage is referred to as a second type gas or a gas of a second type. The first type gas is also used in the first and fifth stages, and the second type gas is also used in the second and sixth stages. The process gas used in the seventh stage is referred to as a third type gas. Thus, the first type gas and the second type gas are alternately supplied to the chamber of a plasma etching apparatus for the first to sixth stages. Operations of these stages may be performed in different plasma etching apparatuses.

In order to form openings 203 and 204 in the insulator layers 30 and 40 made of different materials, respectively, the process gases may be changed between the third stage and the fourth stage to change the high etching component.

The present inventors found that it is effective in forming a hole having a smooth side wall to protect the side walls of the openings 203 and 204 when opening 204 is formed in the fourth stage. When an opening is formed in a lower insulator layer, the opening that has been formed in the upper layer is undesirably etched, and consequently the diameter of the opening is increased. This makes the diameters in the insulator layers discontinuous and allows the hole 210 to have a rough surface at the side wall. Therefore a high deposition component is added to the process gas used in the fourth stage.

The high etching component and the high deposition component in the process gas for the fourth stage are different. One of the reasons of this is that the range of choices of a gas having a high etching power and a high deposition ability for silicon carbide layers is narrow. Also, the tapered angle of the hole 210 is set depending on balance between deposition and etching. It is therefore very advantageous in controlling the tapered angle of the hole 210 that the ratio of the flow rates of the high deposition component and the high etching component can be controlled.

The process gas used in the third stage contains a high etching component exhibiting a high etching power for the insulator layer 30. When the insulator layer 30 is made of silicon oxide, the high etching component may be a mixed gas of $C_4F_8$ and $CHF_3$. The process gas for the third stage also contains a high deposition component (deposition gas) that can be deposited on the side wall of the opening 203 in the insulator layer 30 to form a protective coating. Since the mixed gas of $C_4F_8$ and $CHF_3$ cited as a high etching component have a high deposition ability, the mixed gas may double as a high etching component and a high deposition component. Thus, a process gas containing a high etching component and a high deposition component can etch the bottom of the opening 203 while forming a protective coating on the side wall of the opening 203. Consequently, the opening 203 is tapered in such a manner that the diameter decreases in the direction toward the substrate 100. In the present embodiment, a mixed gas of $C_4F_8$ and $CHF_3$ is used as both a high etching component (high etching gas) and a high deposition component (deposition gas). A gas acting as a high etching component and a low deposition component may be used as the high etching component, and a gas acting as a low etching component and a high deposition component may be used as the high deposition component. The hole 210 need not be forwardly tapered. In this instance, the first type gas need not contain a high deposition component.

The etching rate $R_{11}$ of the plasma etching for the insulator layer 30 using the first type gas and the etching rate $R_{12}$ of the plasma etching for the insulator layer 40 using the first type gas desirably satisfy the relationship $R_{11} > R_{12}$. Under the condition satisfying this relationship, the insulator layer 40 exposed after the third stage in the opening 203 passing through the insulator layer 30 can be prevented from being etched. Thus the insulator layer 40 is etched in the fourth stage, but not in the third stage. Thus the insulator layer 40 can be prevented from being etched across different states. Consequently, the openings 203 and 204 having continuous smooth side walls can be formed. Desirably, the etching rates satisfy the relationship $R_{11}/R_{12} \geq 15$. $R_{11}/R_{12}$ represents the selectivity of the insulator layer 30 to the insulator layer 40 for the first type gas. When the selectivity is 15 or more, in-pane irregularity and variation among products can be reduced and, thus, the working precision can be increased to a satisfactory level in practice.

The second type gas as the process gas used in the fourth stage, contains a high etching component exhibiting a high etching power for the insulator layer 40 and, in addition, a high deposition component. When insulator layer 40 is made of silicon carbide, the high etching component may be $CF_4$. $CH_2F_2$ may be the high deposition component.

The process gas for the fourth stage also contains a deposition gas that can be deposited on the side wall of the opening 204 in the insulator layer 40 to form a protective coating. The high etching component $CF_4$ is not deposited much (has low deposition ability). The high etching component $CF_4$ of the second type gas, whose deposition ability is lower than that of the mixed gas of $C_4F_8$ and $CHF_3$ as the high etching component of the first type gas, is substantially used as a gas that cannot be easily deposited. The second type gas therefore further contains a high deposition component $CH_2F_2$ having a higher deposition ability than the high etching component $CF_4$, in addition to $CF_4$. Thus, such a process gas containing a high etching component and a high deposition component can etch the bottom of the opening 204 while forming a protective coating on the side walls of not only the opening 204, but also of the opening 203. Consequently, the opening 204 is tapered in such a manner that the diameter decreases in the direction toward the substrate 100.

The etching rate $R_{21}$ of the plasma etching for the insulator layer 30 or the insulator layer 50 using the second type gas and the etching rate $R_{22}$ of the plasma etching for the insulator layer 40 using the second type gas desirably satisfy the relationship $R_{21} > R_{22}$. The etching rate $R_{21}$ for the insulator layer 30 and the etching rate $R_{21}$ for the insulator layer 50 are the same because the materials of these insulator layers are the same. Under the condition satisfying this relationship, the etching of the insulator layer 30 can be suppressed while the opening 204 is formed in the insulator layer 40. Thus, the side wall of the opening 203 can be prevented from being deformed. In addition, the insulator layer 50 exposed in the opening 204 passing through the insulator layer 40 can be prevented from being etched. Consequently, the openings 203 and 204 and the openings 204 and 205 can have continuous smooth side walls. Desirably, the etching rates $R_{21}$ and $R_{22}$ satisfy the relationship $R_{22}/R_{21} \geq 2$. $R_{22}/R_{21}$ represents the selectivity of the insulator layer 40 to the insulator layer 30 or 50 for the second type gas. When the selectivity is 2 or more, in-pane irregularity and variation among products can be reduced and, thus, the working precision can be increased to a satisfactory level in practice.

In the present embodiment, it is advantageous to satisfy the relationship $R_{11} > R_{22}$. When the insulator layer 40 is made of silicon carbide and the insulator layers 30 and 50 are made of silicon oxide, $R_{11} > R_{22}$ holds true under practical conditions because silicon carbide is more difficult to etch than silicon oxide under. The present embodiment is suitable for the case where etching with low selectivity is difficult as in the case of the combination of a silicon carbide layer and a silicon oxide layer. When $R_{11} > R_{22}$ holds true, etching using the second type gas, such as the fourth stage, can take more time than etching using the first type gas, such as third stage, even though the thickness of the insulator layer 40 is smaller than that of the insulator layer 30. It is therefore advantageous to add a deposition component to the second type gas from the viewpoint of protecting the side walls of the openings that have been formed in the preceding stages. If the second type gas does not contain a deposition component, the condition of $R_{21} > R_{12}$ is likely to result in increased damage to the insulator layer 30. The effect of the deposition component added to the second type gas is great. Accordingly, an embodiment satisfying both relationships $R_{11} > R_{22}$ and $R_{21} > R_{12}$ is advantageous. In the case satisfying both the relationships $R_{11} > R_{22}$ and $R_{21} > R_{12}$, $R_{11}/R_{12} > R_{22}/R_{21}$ holds true. In the present embodiment, a hole can be formed in a favorable shape even under such conditions.

From the selectivities above, $R_{11}/R_{12} > R_{22}/R_{21} > 1$ holds true. It is desirable to satisfy the relationship $5 \leq (R_{11}/R_{12})/(R_{22}/R_{21}) \leq 20$. By controlling the difference in selectivity between the third stage and the fourth stage in this range, variation in tapered angle among the openings can be reduced.

In the process gas for the fourth stage, the flow rate of the high etching component ($CF_4$) and the flow rate of the high deposition component ($CH_2F_2$) desirably does not have a large difference. Preferably, the flow rate of one of the two components is in the range of 0.5 to 2 relative to the flow rate of the other.

If the amount of the high deposition component is excessively larger than that of the high etching component, the reaction product of the fourth stage may be deposited on the bottom surface of the opening 204 in the course of formation, and thus hinder the etching of the insulator layer 40.

In contrast, if the amount of the high deposition component is excessively smaller than that of the high etching component, the side wall of the opening 204 may become nearly perpendicular, or the opening 204 may become larger than the opening 203. Furthermore, the protective coating formed of the reaction product of the third stage deposited on the side wall of the opening 203 may be removed, and the insulator layer 30 may be further etched.

When a mixed gas of $CF_4$ and $CH_2F_2$ is used in the fourth stage, the flow rate ratio of $CF_4$ to $CH_2F_2$ (flow rate of $CF_4$/flow rate of $CH_2F_2$) may be controlled in the range of 0.7 to 1.3 for forming an extremely favorable forwardly tapered shape.

The relationship between the third stage and the fourth stage in the combination of the insulator layers 30 and 40 has been described. For the insulator layer 10 opposite the substrate 100 with respect to the insulator layer 30, which is made of the same material as the insulator layer 30, the first stage can be performed in the same manner as the third stage. Also, for the insulator layer 20 between the insulator layer 30 and the insulator layer 10, made of the same material as the insulator layer 40, the second stage can be performed in the same manner as the fourth stage. For the insulator layer 50 closer to the substrate 100 than the insulator layer 30, made of the same material as the insulator layer 30, the fifth stage can be performed in the same manner as the third stage. Also, for the insulator layer 60 between the insulator layer 50 and the substrate 100, made of the same material as the insulator layer 40, the sixth stage can be performed in the same manner as the fourth stage.

The third type gas as the process gas used in the seventh stage, contains a gas acting as both a high etching component for the insulator layer 70 and a high deposition component. This is for the purpose of forming a favorable forwardly tapered shape as in the first, third and fifth stages. Different gases may be used as the high etching component and the high deposition component.

The third type gas however contains a different high etching component from the first type gas. More specifically, the high etching component of the third type gas is $C_4F_6$ while the high etching component of the first type gas is a mixed gas of $C_4F_8$ and $CHF_3$. The high etching component of the third type gas may be $C_4F_8$. Although, in this instance, the difference between the first type gas and the third type gas is the presence or absence of $CHF_3$, it can be said that the compositions of the first and third gases are different. $C_4F_8$ and $CHF_3$ can act as high etching components for both a silicon oxide layer and a silicate glass layer. Accordingly, the third type gas need not be different from the first type gas in view of simply etching the insulator layer 70. The reason why the third type gas shown in the Table is different from the first type gas is to suppress the etching of the silicon nitride layer 109 defining the bottom of the hole 210 while the opening 207 is formed in the insulator layer 70. In the use of the first type gas, $CHF_3$ containing hydrogen can act as a high etching component for the silicon nitride layer. The third type gas therefore does not contain $CHF_3$. The etching rate $R_{33}$ of the plasma etching for the insulator layer 70 using the third type gas and the etching rate $R_{30}$ of the plasma etching for the silicon nitride layer 109 using the third type gas desirably satisfy the relationship $R_{33} > R_{30}$. Thus, the silicon nitride layer 109 can function as an etching stopper in the seventh stage using the third type gas. Although the bottom of the hole 210 is defined by the silicon nitride layer 109 in the present embodiment, the bottom of the hole 210 may be defined by a silicon oxide layer, a silicon oxynitride layer, a hafnium oxide layer, or the like. In the present embodiment, the silicon nitride layer is used from the viewpoint of enhancing light transmission. The portion of the "predetermined layer" not required to have light transmission may be made of silicon carbide. In this case, the silicon carbide layer can function as an etching stopper when the insulator layer 70 is etched with the first type gas instead of the third type gas.

FIGS. 5A to 5D are schematic sectional views illustrating the method for manufacturing an image sensing device according to another embodiment of the invention.

The image sensing device of this embodiment has an integrated structure of a semiconductor layer 301 including a photoelectric conversion circuit having photoelectric conversion portions 101 and amplification transistors, and a substrate 100 including a signal processing circuit. For this image sensing device, Japanese Patent Laid-Open Nos. 2010-245506 and 2011-096851 may be referenced.

FIG. 5A shows the step of preparing a first member 1 and a second member 2.

The first member 1 includes the substrate 100 including the signal processing circuit, a first insulator film 121 overlying the substrate 100, and three conductor layers held in the first insulator film 121.

The first insulator film 121 encloses the gate electrodes 410 of the transistors of the signal processing circuit and includes insulator layers 71, 80, 81, 82, 83 and 84 in the order toward the substrate 100. Insulator layers 71, 80, 82 and 84 are made of, for example, silicon oxide or silicate glass. Insulator layers 81 and 83 are made of, for example, silicon nitride and function as anti-diffusion layers for copper conductor layers 411 and 412. The insulator layers 71, 80, 82 and 84 have larger thicknesses than the insulator layers 81 and 83. The first member 1 also includes an aluminum conductor layer 413 between the insulator layer 72 and the insulator layer 80.

The second member 2 includes the substrate 300 including the photoelectric conversion portion 101, a second insulator film 122 disposed on the substrate 300, and three conductor layers held in the second insulator film 122.

The second insulator film 122 encloses the gate electrodes 420 of the transistors of the photoelectric conversion circuit and includes insulator layers 10, 20, 30, 40, 50, 60 and 72 in that order from the substrate 300. Insulator layers 10, 30, 50 and 72 are made of, for example, silicon oxide or silicate glass. Insulator layers 20, 40 and 60 are made of, for example, silicon carbide and function as anti-diffusion layers for the copper conductor layers 421, 422 and 423. The insulator layers 10, 30, 50 and 72 have larger thicknesses than the insulator layers 20, 40 and 60. The conductor layer 412 of the copper conductor layers is disposed between the insulator layers 10 and 20 and is nearest the substrate 300.

FIG. 5B shows the step of joining the first member 1 and the second member 2 together in such a manner that the first insulator film 121 and the second insulator film 122 lie between the substrates 100 and 300. The two members may be bound together by plasma binding (direct binding) of the first insulator film 121 and the second insulator film, by metallic bonding using a conductor layer of the first member and a conductor layer of the second member, or by binding with an adhesive. By binding the first member and the second member, a multilayer composite is formed. The integrated member of the first insulator film 121 and the second insulator film 122 is hereinafter referred to as insulator film 120. In FIG. 5B, the joining face between the first insulator film 121 and the second insulator film 122 is indicated by a dotted line. Also, the integrated insulator layer of the insulator layers 71 and 72 is hereinafter referred to as insulator layer 70.

FIG. 5B shows a state after a semiconductor layer 301 including the photoelectric conversion portions 101 has been formed by reducing the thickness of the substrate 300 after integration. The semiconductor layer 301 has a thickness of 1 μm to 10 μm, and typically a thickness of 3 μm to 5 μm. The semiconductor layer 301 is covered with a dielectric film 302. The dielectric film 302 may include a silicon nitride or hafnium oxide antireflection layer, a color filter layer, or a microlens array.

FIG. 5C shows the step of forming holes 210 and 220 passing through the dielectric film 302 and the semiconductor layer 301. The hole 210 reaches the conductor layer 413 of the first member 1, passing through the insulator layers 10, 20, 30, 40, 50, 60 and 70. Hence, the conductor layer 413 is the "predetermined layer" defining the bottom of the hole 210. The hole 220 reaches the conductor layer 421 of the second member 2, passing through the insulator layer 10. Hence, the conductor layer 421 is the "predetermined layer" defining the bottom of the hole 220. The holes 210 and 220 may be independently formed in different steps or may be formed in parallel throughout the formation. Alternatively, part of the holes may be formed in parallel, and the rest of the holes may be formed in different steps. For forming the hole 210, insulator layers 10, 30, 50 and 70 can be etched with a first type gas while insulator layers 20, 40 and 60 can be etched with a second type gas, as in the description with reference to FIGS. 3A to 4D. The first type gas contains a high etching component for etching the silicon oxide insulator layers 10, 30, 50 and 70. The second type gas contains a high etching component different from the high etching component of the first type gas for etching the silicon carbide insulator layers. The second type gas further contains a high deposition component having higher deposition ability than the high etching component of the second type gas so as to form a favorable tapered shape. As the formation of the hole 210 progresses, openings are formed in the insulator layers 10, 20, 30, 40, 50, 60 and 70. In the dielectric film 302, a recess 230 is formed to link the hole 210 to the hole 220.

FIG. 5D shows the step of filling the holes 210 and 220 and the recess 230 with a conductive filling material 240. Before filling the holes, the side walls of the holes 210 and 220 are covered with an insulating coating (not shown) to ensure electrical isolation between the semiconductor layer 301 and the conductive filling material 240. The material filling the holes 210 and 220 and the recess 230 may be copper, tungsten, or the like. The step of filling the holes 210 and 220 and the recess 230 may be performed by a dual damascene process. Thus, the conductor layer 413 is electrically connected to the conductor layer 421 with a conductive member 150 made of the conductive material filling the holes 210 and 220 and the recess 230. In this structure, signals according to the signal charge generated at the photoelectric conversion portion 101 in the semiconductor layer 301 can be processed in the signal processing circuit in the substrate 100.

The hole 210 formed in the present embodiment has a smooth side wall. This reduces the possibility of the occurrence of voids or filling failure that may occur while the holes are filled with the filling material 240. Consequently, the electrical reliability of the conductive member 150 is increased.

According to an embodiment of the invention, a hole having a smooth side wall can be formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-124598, filed Jun. 13, 2013, which is hereby incorporated by reference herein in its entirety.

What is claimed is:

1. A method for manufacturing an electronic device, comprising:
    forming a hole in a multilayer insulator film including a first insulator layer overlying a substrate, a second insulator layer disposed between the substrate and the first insulator layer and made of a different material from the first insulator layer, the first insulator layer having a larger thickness than the second insulator layer, and a third insulator layer disposed between the second insulator layer and the substrate and made of a different material from the second insulator layer, the hole being in a tapered shape of which diameter decreases in a direction toward the substrate; and
    filling the hole,
    wherein the forming of the hole includes:
    partially removing the first insulator layer to form an opening passing through the first insulator layer by plasma etching using a gas of a first type containing a first component capable of etching the first insulator layer;
    partially removing the second insulator layer to form an opening passing through the second insulator layer by plasma etching using a gas of a second type containing a second component that is not contained in the gas of the first type and is capable of etching the second insulator layer, and a third component having a higher deposition ability than the second component; and
    partially removing the third insulator layer to form an opening passing through the third insulator layer by plasma etching using a gas of the first type.

2. The method according to claim 1, wherein the plasma etchings are performed under a condition satisfying at least one of the following relationships (i) to (iii):
    (i) $R_{11} > R_{12}$ and $R_{22} > R_{21}$;
    (ii) $R_{11}/R_{12} > R_{22}/R_{21}$; and
    (iii) $R_{11} > R_{22}$,
    wherein $R_{11}$ represents the etching rate at which a gas of the first type etches the firs insulator layer, $R_{12}$ represents the etching rate at which a gas of the first type etches the second insulator layer, $R_{21}$ represents the etching rate at which a gas of the second type etches the first insulator layer, and $R_{22}$ represents the etching rate at which a gas of the second type etches the second insulator layer.

3. The method according to claim 1, wherein the insulator film satisfies at least one of the following (a), (b) and (c):
    (a) the third insulator layer has a larger thickness than the second insulator layer;
    (b) a conductor layer containing copper overlies the substrate, and the diffusion coefficient of the copper is lower in the second insulator layer than in the first insulator layer; and
    (c) the first insulator layer is disposed between a first conductor layer and a second conductor layer overlying the substrate, wherein the second conductor layer is more distant from the substrate than the first conductor layer.

4. The method according to claim 1, wherein the insulator film further includes a fourth insulator layer between the third insulator layer and the substrate so as to lie on a predetermined layer, wherein the forming of the hole further includes partially removing the fourth insulator layer to form an opening passing through the fourth insulator layer by plasma etching using a gas of the third type so that the predetermined layer defines the bottom of the hole, and the plasma etching using the gas of the third type is performed under a condition satisfying the relationship $R_{33} > R_{30}$, wherein $R_{33}$ represents the etching rate at which the gas of the third type etches the fourth insulator layer, and $R_{30}$ represents the etching rate at which the gas of the third type etches the predetermined layer.

5. The method according to claim 4, wherein the predetermined layer is made of a material different from the second insulator layer, and the gas of the third type contains a component for etching the fourth insulator layer, different from the first component of the gas of the first type.

6. The method according to claim 1, wherein the hole is filled with a dielectric material having a higher refractive index than the first insulator layer.

7. The method according to claim 1, wherein the second insulator layer is made of silicon carbide.

8. A method for manufacturing an electronic device, comprising forming a hole in a multilayer insulator film including a first insulator layer overlying a substrate, a second insulator layer disposed between the substrate and the first insulator layer and made of a different material from the first insulator layer, and a third insulator layer disposed between the second insulator layer and the substrate and made of a different material from the second insulator layer, the forming of the hole including:
partially removing the first insulator layer to form an opening passing through the first insulator layer by plasma etching using a gas of a first type containing a first component capable of etching the first insulator layer;
partially removing the second insulator layer to form an opening passing through the second insulator layer by plasma etching using a gas of a second type containing a second component that is not contained in the gas of the first type and is capable of etching the second insulator layer, and a third component having a higher deposition ability than the second component; and
partially removing the third insulator layer to form an opening passing through the third insulator layer by plasma etching using a gas of the first type,
wherein the first component has a higher deposition ability than the second component, and the hole is in a tapered shape of which diameter decreases in a direction toward the substrate.

9. The method according to claim 8, wherein the insulator film satisfies at least one of the following (x), (y) and (z):
(x) the first insulator layer has a larger thickness than the second insulator layer;
(y) a conductor layer containing copper overlies the substrate, and the diffusion coefficient of the copper is lower in the second insulator layer than in the first insulator layer; and
(z) the first insulator layer is disposed between a first conductor layer and a second conductor layer overlying the substrate, wherein the second conductor layer is more distant from the substrate than the first conductor layer.

10. The method according to claim 8, wherein the hole is filled with a dielectric material having a higher refractive index than the first insulator layer.

11. The method according to claim 8, wherein the second insulator layer is made of silicon carbide.

12. A method for manufacturing an electronic device, comprising:
forming a hole in a multilayer insulator film including a first insulator layer overlying a substrate, a second insulator layer disposed between the substrate and the first insulator layer and made of a different material from the first insulator layer, the first insulator layer having a larger thickness than the second insulator layer, a third insulator layer disposed between the second insulator layer and the substrate and made of a different material from the second insulator layer, a fourth insulator layer between the third insulator layer and the substrate, a fifth insulator layer disposed opposite the substrate with respect to the first insulator layer and containing the same material as the first insulator layer, and a sixth insulator layer disposed between the fifth insulator layer and the first insulator layer and containing the same material as the second insulator layer,
the forming of the hole including:
partially removing the first insulator layer to form an opening passing through the first insulator layer by plasma etching using a gas of a first type containing a first component capable of etching the first insulator layer;
partially removing the second insulator layer to form an opening passing through the second insulator layer by plasma etching using a gas of a second type containing a second component that is not contained in the gas of the first type and is capable of etching the second insulator layer, and a third component having a higher deposition ability than the second component;
partially removing the third insulator layer to form an opening passing through the third insulator layer by plasma etching using a gas of the first type;
partially removing the fifth insulator layer to form an opening passing through the fifth insulator layer by plasma etching using a gas of the first type, and
partially removing the sixth insulator layer to form an opening passing through the sixth insulator layer by plasma etching using a gas of the second type.

13. The method according to claim 12, wherein the insulator film further including a seventh insulator layer disposed between the second insulator layer and the third insulator layer and containing the same material as the first insulator layer, and an eighth insulator layer disposed between the sixth insulator layer and the third insulator layer and containing the same material as the second insulator layer, and the forming of the hole includes partially removing the seventh insulator layer to form an opening passing through the seventh insulator layer by plasma etching using a gas of the first type, and partially removing the eighth insulator layer to form an opening passing through the eighth insulator layer by plasma etching using a gas of the second type.

14. A method for manufacturing an electronic device, comprising forming a hole in a multilayer insulator film including a first silicon oxide layer overlying a substrate, a silicon carbide layer between the first silicon oxide layer and the substrate, and a second silicon oxide layer between the silicon carbide layer and the substrate, the forming of the hole including:
partially removing the first silicon oxide layer to form an opening passing through the first silicon oxide layer by plasma etching using a gas containing at least one of $C_4F_8$ and $CHF_3$;
partially removing the silicon carbide layer to form an opening passing through the silicon carbide layer by plasma etching using a gas containing $CF_4$ and $CH_2F_2$; and
partially removing the second silicon oxide layer to form an opening passing through the second silicon oxide layer by plasma etching using a gas containing at least one of $C_4F_8$ and $CHF_3$.

15. The method according to claim 14, wherein the gases used in partially removing the first silicon oxide layer contains both of $C_4F_8$ and $CHF_3$ and further contains Ar and $O_2$, and the gas used in partially removing the second silicon oxide layer contains both of $C_4F_8$ and $CHF_3$ and further contains Ar and $O_2$.

16. The method according to claim 14, wherein the flow rate ratio of the $CF_4$ to the $CH_2F_2$ is in the range of 0.7 to 1.3.

17. The method according to claim 16, wherein the plasma etching of the silicon carbide layer is performed under the conditions of an RF power in the range of 100 W to 4000 W, a total gas pressure in the range of 10 mTorr to 100 mTorr, an Ar flow rate in the range of 50 sccm to 1000 sccm, and flow rates of $CF_4$, $CH_2F_2$, and $O_2$ in the range of 5 sccm to 50 sccm.

18. The method according to claim 14, wherein the insulator layer further includes a third silicon oxide layer between the second silicon oxide layer and the substrate, and the forming of the hole further includes partially removing the third silicon oxide layer to form an opening passing through the third silicon oxide layer by plasma etching using a gas containing $C_4F_6$ so that a silicon nitride layer between the third silicon oxide layer and the substrate defines the bottom of the hole.

19. The method according to claim 14, further comprising forming a silicon nitride coating over the side wall of the hole and then filling the hole with a resin.

20. The method according to claim 14, further comprising filling the hole with a dielectric material and forming a microlens array after the filling of the hole.

* * * * *